(12) United States Patent
Leong

(10) Patent No.: US 7,256,598 B2
(45) Date of Patent: Aug. 14, 2007

(54) NON-ABRASIVE ELECTRICAL TEST CONTACT

(76) Inventor: Tan Yin Leong, Blk 22 St. George's Road #25-182, Singapore (SG) 321022

( * ) Notice: Subject to any disclaimer, the term of this patent is extended or adjusted under 35 U.S.C. 154(b) by 0 days.

(21) Appl. No.: 11/460,632

(22) Filed: Jul. 28, 2006

(65) Prior Publication Data
US 2006/0279320 A1 Dec. 14, 2006

Related U.S. Application Data

(63) Continuation of application No. 10/887,908, filed on Jul. 12, 2004, now abandoned.

(30) Foreign Application Priority Data
Mar. 8, 2003 (SG) .............................. 200401167-2

(51) Int. Cl.
*G01R 31/02* (2006.01)
(52) U.S. Cl. ........................ 324/761; 324/765; 439/70
(58) Field of Classification Search .................... None
See application file for complete search history.

(56) References Cited
U.S. PATENT DOCUMENTS 4,012,094 A * 3/1977 VanRenssen et al. ......... 439/58
4,384,757 A * 5/1983 Andrews et al. ............ 439/736
4,997,378 A    3/1991 Matsuoka et al.
5,308,256 A    5/1994 Tonooka
5,952,843 A * 9/1999 Vinh .......................... 324/761
5,998,228 A * 12/1999 Eldridge et al. .............. 438/15
6,396,294 B2 * 5/2002 An et al. ..................... 324/761
6,830,461 B2 * 12/2004 Sakamoto et al. ............ 439/66

* cited by examiner

*Primary Examiner*—Ha Tran Nguyen
*Assistant Examiner*—Richard Isla-Rodas
(74) *Attorney, Agent, or Firm*—Lawrence Y. D. Ho & Associates Pte Ltd

(57) ABSTRACT

A hybrid non-abrasive electrical test contact element of a test socket is taught. Unlike cantilever contact elements of the prior art, the contact element of the present invention is able to contact a lead of an integrated circuit device under test without abrading the plating on the lead. This is achieved by the contact element possessing multiple loops to allow the tip of the contact element to move not only downwards, but also sideways in a rocking and non-sliding motion. The tip of the contact is also shaped to contact the lead at only a radius corner of each lead so as not to affect the solderability of the lead. In addition, tests have shown that the contact element of the present invention has at least twice the working life span compared to another contact element of the prior art.

14 Claims, 6 Drawing Sheets

40

Present Invention
- Contact marks after 15 insertions
- No exposed copper observed Conventional Contact
- Contact marks after 15 insertions
- Exposed copper on bottom of contact foot, risk of solderability failure

| DATE | HANDLER | PACKAGE | DEVICE | LOT | QTY IN | QTY OUT | TEST YIELD | RVS IN | RVS OUT | RVS YIELD | P.SYIELD |
|---|---|---|---|---|---|---|---|---|---|---|---|
| 4-Feb-08 | SX18 | 10X10 44L | UD40 | 994051KX05 | 3268 | 3201 | 97.95% | | 3194 | 99.78% | 97.74% |
|  | SX18 | 10X10 44L | UD40 | 994051KX05 | 5384 | 5282 | 98.11% | | 5280 | 99.96% | 98.07% |
| 5-Feb-08 | SX18 | 10X10 44L | UD40 | 994052ZW04 | 3118 | 3039 | 97.47% | | 3030 | 99.70% | 97.18% |
|  | SX18 | 10X10 44L | UD40 | 994051RY03 | 3231 | 3180 | 98.42% | | 3180 | 100.00% | 98.42% |
| 6-Feb-08 | SX18 | 10X10 44L | UD40 | 994052K101 | 5342 | 5227 | 97.85% | | 5218 | 99.83% | 97.68% |
|  | SX18 | 10X10 44L | UD40 | 994052K105 | 3138 | 3101 | 98.82% | | 3101 | 100.00% | 98.82% |
| 7-Feb-08 | SX18 | 10X10 44L | UD40 | 994060MJ02 | 5356 | 5248 | 97.98% | | 5243 | 99.90% | 97.89% |
|  | SX18 | 10X10 44L | UD40 | 994052K104 | 3137 | 3035 | 96.75% | | 3030 | 99.84% | 96.59% |
| 8-Feb-08 | SX18 | 10X10 44L | UD40 | 994060F503 | 5361 | 5256 | 98.04% | | 5254 | 99.96% | 98.00% |
|  | SX18 | 10X10 44L | UD40 | 994060KQ01 | 5393 | 5290 | 98.09% | | 5281 | 99.83% | 97.92% |
| 9-Feb-08 | SX18 | 10X10 44L | UD40 | 994061B702 | 5387 | 5230 | 97.09% | | 5217 | 99.75% | 96.84% |
| 10-Feb-08 | SX18 | 10X10 44L | UD40 | 994060F402 | 4417 | 4379 | 99.14% | | 4370 | 99.79% | 98.94% |
|  | SX18 | 10X10 44L | UD40 | 994060MK03 | 2798 | 2762 | 98.71% | | 2754 | 99.71% | 98.43% |
| 11-Feb-08 | SX18 | 10X10 44L | UD40 | 994061B702 | 5389 | 5255 | 97.51% | | 5250 | 99.90% | 97.42% |
|  | SX18 | 10X10 44L | UD40 | 994061HA04 | 3816 | 3759 | 98.51% | | 3754 | 99.87% | 98.38% |
| 12-Feb-08 | SX18 | 10X10 44L | UD40 | 994061HA04 | 5370 | 5295 | 98.60% | | 5290 | 99.91% | 98.51% |
|  | SX18 | 10X10 44L | UD40 | 994061HA05 | 3819 | 3694 | 96.73% | | 3690 | 99.89% | 96.62% |
| 13-Feb-08 | SX18 | 10X10 44L | UD40 | 994061B704 | 2781 | 2710 | 97.45% | | 2706 | 99.85% | 97.30% |
|  | SX18 | 10X10 44L | UD40 | 994062M05 | 3448 | 3380 | 98.03% | | 3374 | 99.82% | 97.85% |
| 14-Feb-08 | SX18 | 10X10 44L | UD40 | 994062H04 | 3472 | 3422 | 98.56% | | 3416 | 99.82% | 98.39% |
|  | SX18 | 10X10 44L | UD40 | 994062GY04 | 3511 | 3499 | 99.66% | | 3492 | 99.80% | 99.46% |
| 15-Feb-08 | SX18 | 10X10 44L | UD40 | 994062GY05 | 3508 | 3441 | 98.09% | | 3437 | 99.88% | 97.98% |
|  | SX18 | 10X10 44L | UD40 | 994062GM01 | 2983 | 2929 | 98.19% | | 2921 | 99.73% | 97.92% |
| 16-Feb-08 | SX18 | 10X10 44L | UD40 | 994062GM03 | 5368 | 5278 | 98.32% | | 5266 | 99.77% | 98.10% |
|  | SX18 | 10X10 44L | UD40 | 994060KQ05 | 3466 | 3402 | 98.15% | | 3393 | 99.74% | 97.89% |
| 17-Feb-08 | SX18 | 10X10 44L | UD40 | 994060KQ06 | 3435 | 3418 | 99.51% | | 3412 | 99.82% | 99.33% |
|  | SX18 | 10X10 44L | UD40 | 994070ca04 | 5364 | 5302 | 98.84% | | 5301 | 99.98% | 98.83% |
| 18-Feb-08 | SX18 | 10X10 44L | UD40 | 994062g603 | 5368 | 5285 | 98.08% | | 5255 | 99.81% | 97.89% |
|  | SX18 | 10X10 44L | UD40 | 994070c706 | 4624 | 4592 | 99.31% | | 4585 | 99.85% | 99.16% |
|  |  |  |  | TOTAL | 121054 | 118871 | 98.20% | | 118694 | 99.85% | 98.05% |

*FIG. 6*

NON-ABRASIVE ELECTRICAL TEST CONTACT

CROSS-REFERENCE TO RELATED APPLICATION

This application is a continuation of application Ser. No. 10/887,908, filed on Jul. 12, 2004 now abandoned.

FIELD OF THE INVENTION

The present invention relates to a conductive contact element of a test socket.

In particular, this invention relates to a contact element for a test socket in semiconductor test equipment for testing a lead of a semiconductor or device under test.

BACKGROUND OF THE INVENTION

Semiconductor integrated circuit devices (ICs or "chips") have to be tested for quality control as part of the manufacturing process. Automatic test equipment (ATE) are used to insert each chip (the "device under test" or DUT) into test sockets for testing. The ATE and their components are expected to last many thousands of test cycles. Any reduction in the cycle time due to equipment failure will contribute to increased costs for the manufacturer.

In addition, the ATE must not damage the chips in the testing process and an otherwise functional IC will be not be usable. This will also contribute to increased cost of manufacture.

During testing, proper electrical contact must be established and maintained between the leads of the DUT and the contacts of the test socket as this will affect the reliability of the test equipment to pick out faulty chips and not reject otherwise functional chips. Thus, this requirement of maintaining good electrical contact places demands on both the leads of the DUT and the test contacts used.

Now, metals are electrically conductive and the choice of the metal for use in the leads of a chip is a balance between cost, conductivity and suitability for use. Most metals are also subject to oxidation or corrosion and leads are usually plated to maintain electrical conductivity by preventing corrosion. Plating of leads also increases the hardness and wear resistance of the base metal and improves solderability at installation of the chip in a device.

Two main kinds of contacts are commonly used in ATE: straight "pogo" contacts with internal coil springs and bent cantilever contacts. The cantilever contact is exemplified by the invention by Yamaichi Electric Manufacturing Company and protected by a U.S. Pat. No. 4,997,378 (FIG. 1A).

In both kinds of contacts, a resilient means, be it the coil spring of the pogo contact or the loop of the cantilever contact, maintains a contact force against the lead of the chip to ensure good electrical contact. For unplated leads, it is desirable for the contact force to be large enough to allow the contact to break through a film of metal oxide on the lead. The contact may also be designed to permit a "wiping" action upon insertion of the DUT into the socket to scrub off this oxide film at the contact interface.

While this penetration or removal of the oxide film is desirable in unplated leads used in semiconductor chips of the past, this is not ideal for newer, plated leads as it will affect the solderability of the leads.

As the cantilever contacts of the prior art are designed to break through oxide layers, these contacts will also abrade the plating of these newer leads, affecting the quality of the soldering. The connection of the leads to the device in which the chip is installed will thus not be good. As such, an overly strong contact force by the contact of the ATE test socket is not desirable or suitable for chips with plated leads.

In addition, cantilever contacts of the prior art also do not have a long service life and must be cleaned and changed frequently.

Therefore, a need clearly exists for a contact that permits good electrical conduction between the lead of a device under test, with the test socket of automated test equipment, without compromising any plating on the lead as well as possessing a longer service life.

SUMMARY OF THE INVENTION

The present invention seeks to provide, in one aspect, a contact element of a test socket for testing an encapsulated semiconductor device having a plurality of leads, the contact element of electrically-conductive material comprising: a socket end; a contact end; and an interconnecting member connecting said socket and contact ends, said interconnecting member comprising at least one S-shaped portion, and said at least one S-shaped portion comprises two substantially 180-degree loops; wherein the contact element contacts a lead of said encapsulated semiconductor device at a radius corner such that the interconnecting member is resilient and provides a non-sliding contact between said contact end and said radius corner.

In another aspect, the present invention provides a method of maintaining the plating on an encapsulated integrated circuit device during testing, the method comprising: contacting the lead at a radius corner with a contact element with a non-sliding contact between said lead and said contact element; wherein the contact element is mountable in a test socket.

BRIEF DESCRIPTION OF THE DRAWINGS

A preferred embodiment of the present invention will now be more fully described, by way of example, with reference to the drawings of which:

FIG. 1A illustrates a cantilever contact of the prior art while

FIG. 2A shows the area of contact between a lead of a DUT and the contact of the prior art while

FIG. 6 is an extract of test data showing contacts of the present invention lasting more than twice the working life span of conventional cantilever contacts.

DETAILED DESCRIPTION OF THE DRAWINGS

A detailed description of the present invention will now be given in accordance with a preferred embodiment of the invention. In the following description, details are provided to describe the preferred embodiment. It shall be apparent to one skilled in the art, however, that the invention may be practiced without such details. Some of these details may not be described at length so as not to obscure the invention.

The main advantage of the preferred embodiment is that good electrical contact between the leads of an electrical device, such as a semiconductor chip, with the contact elements of the test socket is provided without compromising the plating of the leads. The present invention is thus a non-abrasive or non-sliding contact that maintains the plating of the lead.

Another advantage of the present invention is that the contact end of the present invention rolls or rocks without sliding to accommodate the lead as the chip is inserted into the test socket, further minimizing damage to the plating of the lead.

The third advantage is that the present invention further minimizes compromising the plating on a lead by only contacting the lead at a small area at a radius corner. This leaves a large area of the lead un-contacted, further preserving the solderability of the lead.

Figure 1A:
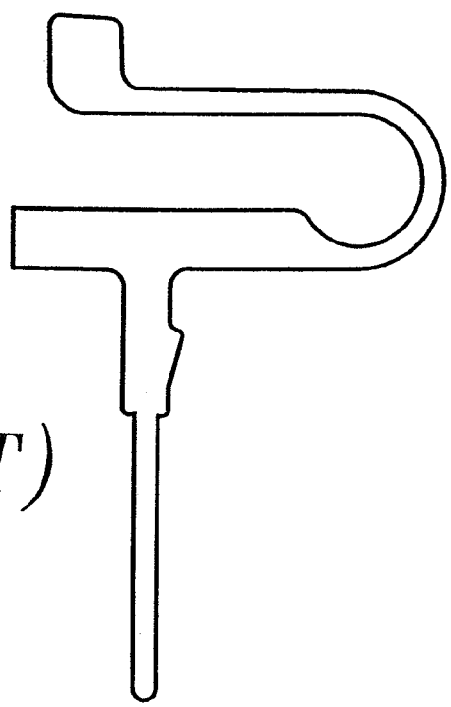

Referring to FIG. 1A, a contact element of the prior art installed in a test socket is shown at rest, in an unloaded position before the insertion of a chip. Orientations and directions such as up or down, given in the description with reference to the contact, are as commonly understood.

A contact element of the prior art may be seen to comprise a loop, wherein a trace of the outline or shape of the contact, when moving from one end of the contact element to the other end, will essentially reverse direction. Under the present invention, a loop is defined as a portion of the contact wherein a trace moving from the start of the loop to the end of the loop will describe a change of direction that is substantially 180° to its original direction before entering the loop. Substantial changes in direction varying from 180°, as commonly understood, is also considered to describe a loop.

Figure 1B:
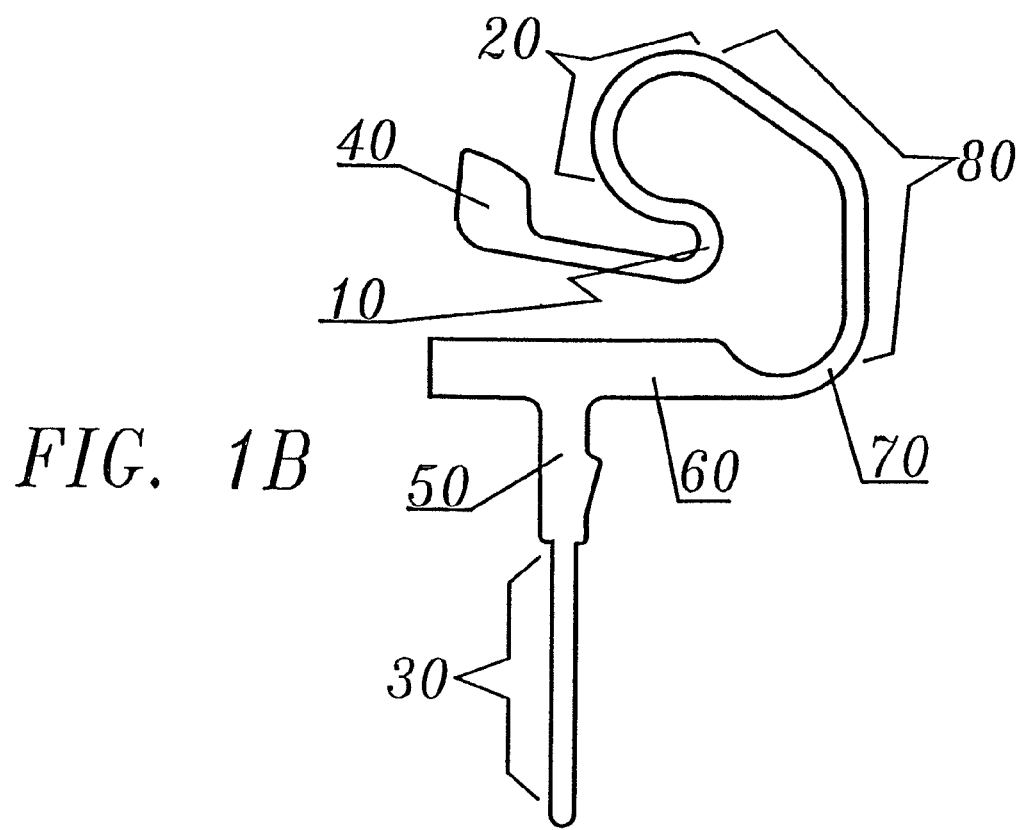
FIG. 1B is the non-abrasive hybrid contact of the present invention.

In a cantilever contact of the prior art (FIG. 1A), it can be seen that such a contact has only one loop acting as its resilient means. The contact of the present invention comprises two or more loops as its resilient means. In the preferred embodiment of the present invention, two loops 10 and 20 are present (FIG. 1B) and are made from one continuous piece of conductive material. It will be appreciated by a person skilled in the art that the present invention differs significantly from a cantilever contact of the prior art (FIG. 1A).

The contact element of present invention has a socket end 30, adapted to connect the contact element to the test socket. At the other extremity is the contact end 40 that touches the lead of an inserted chip, permitting electrical contact between the lead of the chip with the test socket, and hence the ATE (not shown).

Tracing the shape of the contact element of the present invention from the socket end 30 to the contact end 40, it may be seen that the contact first rises essentially vertically up a leg 50 before turning to a first horizontal portion 60.

Figure 3A:
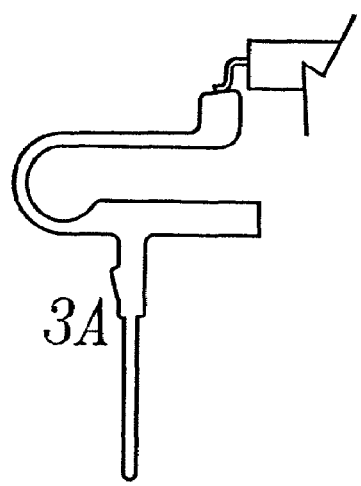
FIGS. 3A-3C and FIGS. 3D-3F are the stages showing how the contact of the present invention (FIG. 3D-3F) accommodates the lead of a device under test as the lead compresses the contact, compared to a conventional cantilever contact (FIGS. 3A-3C)
Figure 3D:
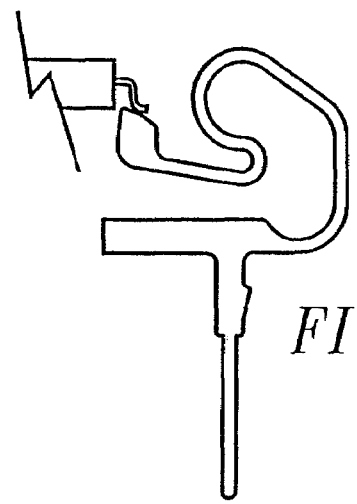
Figure 3B:
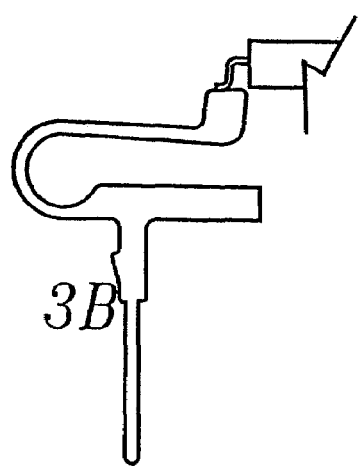
Figure 3E:
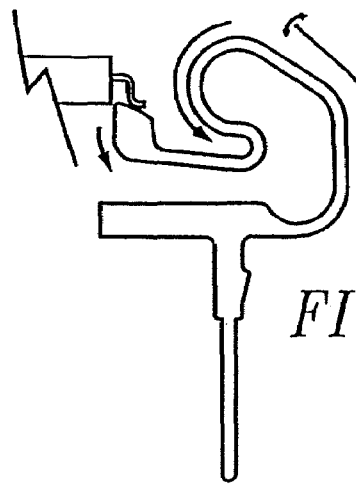
Figure 3C:
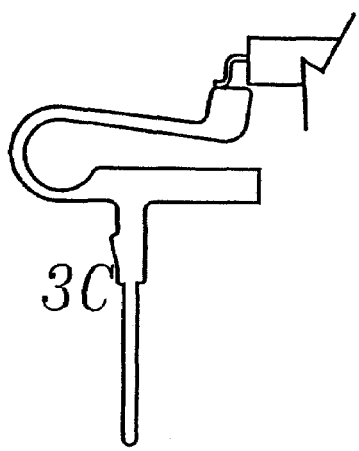

The trace then bends an essentially 90-degree turn 70 upwards, followed by another bend 80 before entering the first loop 20, essentially reversing direction before entering the second loop 10, changing direction significantly and terminating at the contact end 40. Contact elements of the prior art can only move up and down when contacted by the leads of the chip as the chip is being inserted into the test socket (arrows, FIGS. 3A-C).

Figure 3F:
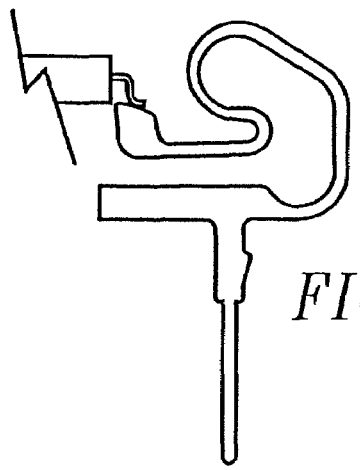

On the other hand, the two loops 10, 20 afford the contact end 40 of the present invention much greater latitude in movement, compared to a cantilever contact of the prior art. In conjunction with the curved profile of the contact end 40, the multiple loops of the present invention permits the contact end 40 to not only move downwards, but also to move laterally (arrows, FIGS. 3D-3F) within the slit of the test socket in which it is housed. The resultant movement is a rocking, rolling or non-sliding motion by the contact end (arrows, FIGS. 3D-3F). This ability to roll with the lead of the inserted chip maintains the plating of the lead by minimizing abrasion of the plating.

While the multiple loops of the present invention are shown to be immediately continuous with each other, it is also possible for other embodiments of the present invention to have multiple loops not immediately continuous. These non-continuous loops may be separated by distinctly straight or bent stretches of the contact material to suit particular applications or to fit within certain design constraints.

While the curved profile of the contact end aids in the rocking or rolling motion of the contact, a person skilled in the art will appreciate that the curved profile alone cannot effect this without the multiple loops of in the present invention. Should this curved profiled be placed on a cantilever of the prior art, the prior art contact will still not be able to effect a rocking, rolling or non-sliding motion.

The contact element of the present invention thus possesses a long trace path compacted into a small area to act as the resilient means and may be viewed as a non-obvious hybrid of the pogo contact and the cantilever contact. A person skilled in the art will appreciate that the contact element of the present invention takes up only a little space thus allowing its use in test sockets with fine pitches between contacts.

The compacting of the long trace path by the inventive arrangement of the multiple loops 10, 20 further offers the additional advantage of the contact end being able to move both vertically and laterally to roll with the lead as the chip is being inserted into the test socket of the ATE. Any sideway deflection of the contact is prevented by the walls of the test socket in which the contact is housed.

Figure 2A:
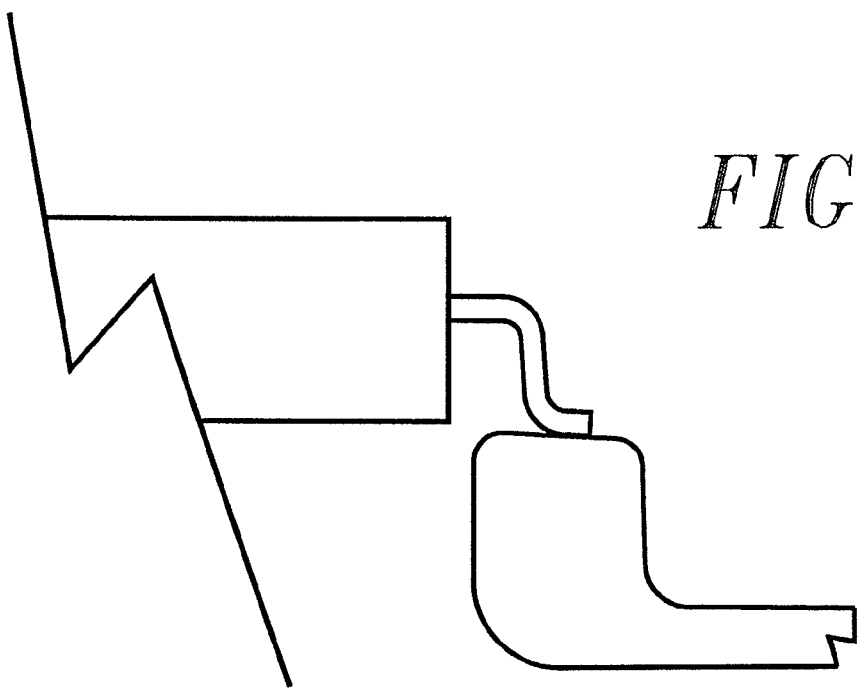
Figure 2B:
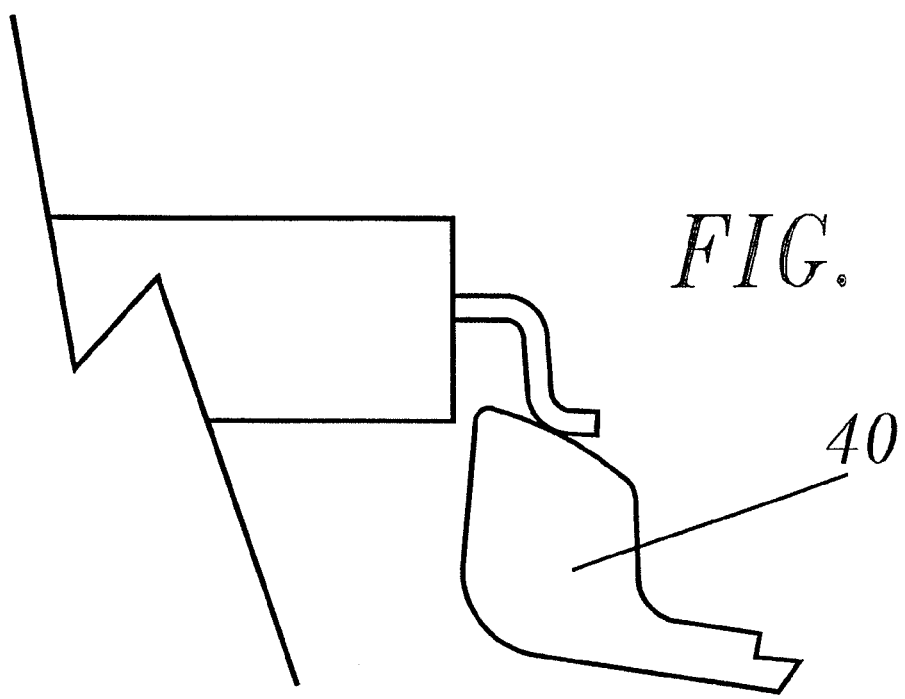
FIG. 2B shows the point of contact between a lead of a DUT with the contact of the present invention.

To allow the contact end 40 to contact only a small portion at a radius corner of the lead of the DUT, the shape or profile of the contact end 40 may also be varied, taken into account the rolling motion of the contact, and the area of the lead to be contacted. As may be seen in FIG. 2A, contacts of the prior art usually contact a large area of the lead. On the other hand, the contact of the present invention is profiled to only contact a small area or point at a radius corner of the lead of the DUT (FIG. 2B). Usually, if the lead is sufficiently long, this area of the lead is proximal to the packaging of the DUT (seen here as the radius of the bent of the lead in FIG. 2B). This is so as not to compromise the solderability of the lead by permitting the distal end of the lead to be soldered upon installation of the chip in another electronic device.

Figure 5:
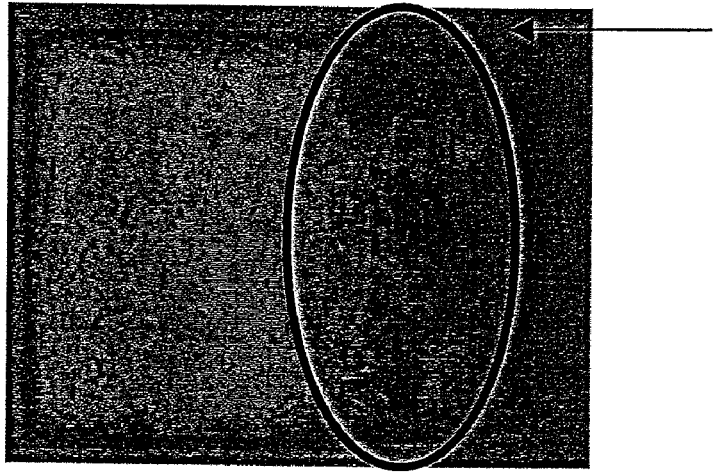
FIG. 5 shows a photograph of a wearing test where a conventional cantilever contact was tested against a contact of the present invention.
Figure 5:
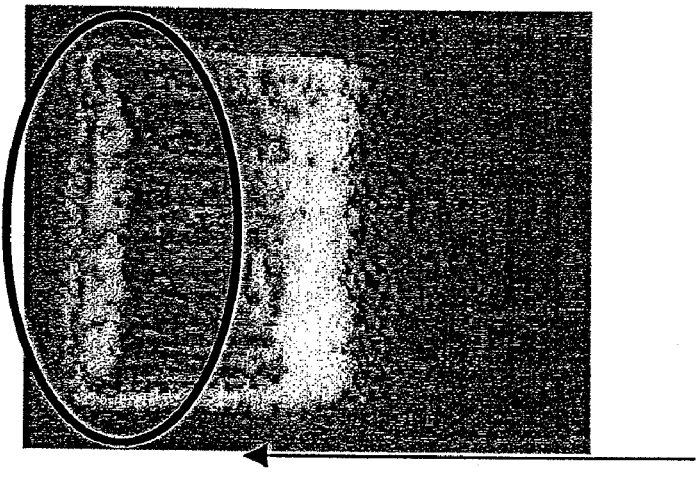

The desired results of the novel and inventive features of the present invention have been realized in side-by-side comparisons with a contact of the present invention in a similar test socket. With the contact element of the prior art, the tin plating on the copper lead of a DUT is abraded after 15 insertions, exposing the underlying copper substrate (FIG. 5). On the other hand, the lead of another piece of the same type of DUT is not abraded or eroded even after 15 insertions with the contact element of the present invention.

It is well-known in the industry that cantilever contacts of the prior art have a test insertion life span of about 60,000 cycles before failure. FIG. 6 is an extract of the data from a test of a test socket with 40 contacts of the present invention in a square configuration (10 contacts on each side). The test showed that the contact elements made of the same materials as that of conventional cantilever contacts have lasted more than 120,000 cycles without failure. At the time of application, the contact elements have exceeded twice the normal working life space of cantilever contacts and have yet to fail. As such, it is the design and shape of the present invention that significantly increased the working life span, not the type of material used.

The contact element of the present invention may be fabricated out of a suitable conductive material, such as beryllium copper, although other metals such as gold, silver and platinum may also be used. The contact element may be fabricated by conventional techniques well-known in the art such as die punching, electro-discharge machining, wire machining, laser cutting or water jet cutting. The contact element may then be hardened to the desired spring temper and finished by deburring and polishing as desired.

Users of the contact element of the present invention will be able to install other embodiments of the present invention adapted to the amount of contact force required for plated leads. The amount of contact force may be obtained by varying several parameters of the contact element. These parameters include the geometry of the loops, the number of loops, the choice of conductive materials used, and the heat treatment for spring temper and hardness. The geometry of the loops comprises the diameter of the loops, the distance of one loop to the next and the magnitude of the changes (angle) in direction of the loops.

By varying these parameters, a user can retrofit existing ATE to accommodate plated leads without investing in entirely new ATE.

The present invention therefore provides a novel and inventive contact element that combines a profiled contact end with a resilient means of multiple loops that overcomes, or at least alleviates, the problems of the prior art in testing semiconductor chips.

Figure 4A:
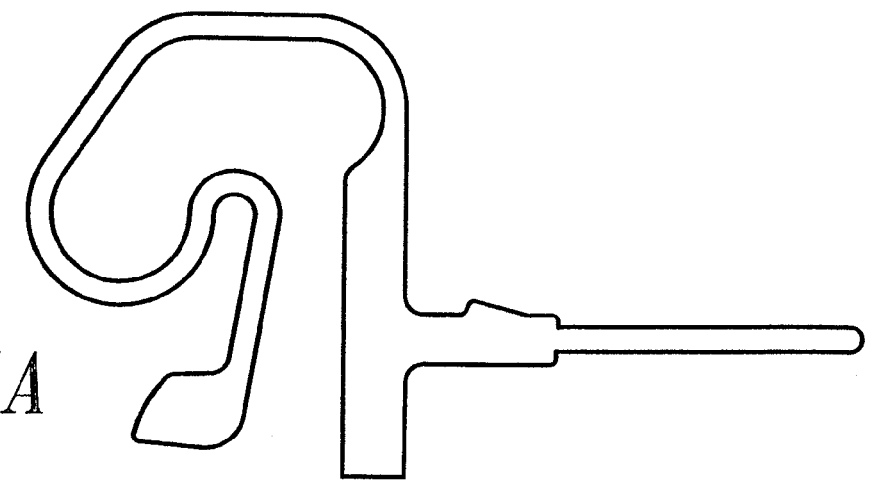
FIG. 4 shows other embodiments of the present invention.
Figure 4B:
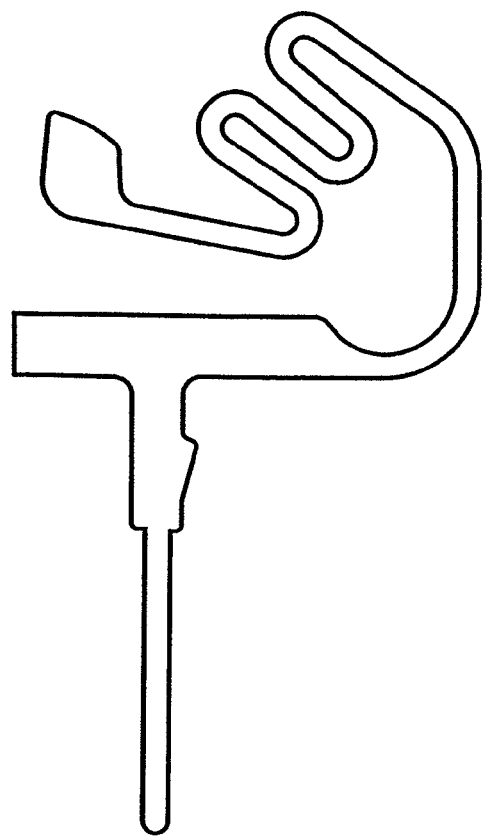

While the contact element of the present invention is used conventionally in the position described and shown in the figures, it may also be used in other positions wherein the chip is not inserted downwards, but laterally (FIG. 4A). Other embodiments of the present invention, such as one with more than two loops, are shown in FIG. 4B.

In addition, while the contact element of the present invention is used primarily in test sockets of automated test equipment, the present invention may also be used to effect electrical contact in any electrical device where its properties of providing a non-abrasive contact force and electrical conduction is desired, scaling its size up or down as appropriate.

It will be appreciated that although one preferred embodiment has been described in detail, various modifications and improvements can be made by a person skilled in the art without departing from the scope of the present invention.

What is claimed is:

1. A contact element of a test socket for testing an encapsulated semiconductor device having a plurality of leads, the contact element of electrically-conductive material comprising:
    a socket end;
    a contact end; and
    an interconnecting member connecting said socket and contact ends, said interconnecting member comprising at least one S-shaped portion, and said at least one S-shaped portion comprises two substantially 180-degree loops, which reverse in direction with respect to the axis of motion of the plurality of leads as the encapsulated semiconductor device is inserted into the test socket;
    wherein each of the plurality of the leads is bent and the contact element contacts a bent lead of said encapsulated semiconductor device at a radiused corner surface such that the interconnecting member is resilient and provides a rolling or non-sliding contact between said contact end and said radiused corner surface.

2. The contact element according to claim 1, wherein the electrically-conductive material is beryllium copper.

3. The contact element according to claim 1, wherein the contact end is profiled to permit contact with the lead at one point.

4. The contact element according to claim 1, wherein the contact end comprises a profile to permit a downward and lateral movement of the contact end in conjunction with the resilient interconnecting member.

5. The contact element according to claim 1, wherein the at least one resilient interconnecting member comprises two or more S-shaped portions.

6. The contact element according to claim 1, wherein the resilient interconnecting member permits both a downward and a lateral movement of the contact as the device is inserted.

7. The contact element according to claim 1, wherein the contact is made of one piece of the electrically-conductive material.

8. The contact element according to claim 1, wherein the non-sliding contact force is obtained by varying at least one parameter of the contact element.

9. The contact element according to claim 8, wherein the at least one parameter comprises:
    a geometry of the loops;
    number of loops;
    choice of electrically-conductive material; and
    heat treatment for spring temper and hardness.

10. The contact element according to claim 9, wherein the geometry of the loops comprises:
    diameter of the loops; and
    distance of one loop to the next loop.

11. A method of maintaining the plating on an electrical lead of an encapsulated integrated circuit device during testing, the method comprising:
    contacting the lead at a radiused corner surfaced with a contact element such that the contact between said lead and a contact end of said contact element is rolling or non sliding;
    wherein:
    the lead is bent to form the rediused corner surface;
    the contact element comprises a socket end, said contact end and an interconnecting member connecting said socket and contact ends, with said interconnecting member comprising at least one S-shaped portion having two substantially 180-degree loops, which reverse in direction with respect to the axis of motion of the plurality of leads as the encapsulated semiconductor device is inserted into the test socket; and
    the socket end is mountable in a test socket.

12. The method according to claim 11, wherein the contact end of said contact element comprises:
    a profiled contact end operable to contact the electrical lead at only one point;
    wherein the contact end is allowed to move downwards and laterally in conjunction with the at least one S-shaped portion, as the encapsulated integrated circuit device is inserted, thereby providing said rolling or non-sliding contact with the electrical lead.

13. The method according to claim 12, further comprising modifying at least one parameter of said contact element to suit the lead of the device.

14. The method according to claim 13, wherein said at least one parameter comprises:
    a geometry of the loops;
    number of loops;
    choice of electrically-conductive material; and
    heat treatment for spring temper and hardness.

* * * * *